(12) United States Patent
Fujiya et al.

(10) Patent No.: US 7,319,596 B2
(45) Date of Patent: Jan. 15, 2008

(54) ELECTRONIC APPARATUS

(75) Inventors: Hiromitsu Fujiya, Kawasaki (JP); Eiji Makabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 118 days.

(21) Appl. No.: 11/387,765

(22) Filed: Mar. 24, 2006

(65) Prior Publication Data

US 2007/0223201 A1    Sep. 27, 2007

(51) Int. Cl.
*H05K 7/20*    (2006.01)

(52) U.S. Cl. .................. 361/727; 361/687; 361/695; 454/184; 165/122; 312/223.2

(58) Field of Classification Search ............. 361/687, 361/690–697, 703, 707, 717–719, 720, 722, 361/724–727, 752, 831; 165/121–127, 185; 454/184; 312/223.2, 223.3, 236, 223.21, 312/265.5; 174/35 R, 35 MS, 99 R, 48, 174/100, 24, 69, 51, 85 R, 58, 52.1
See application file for complete search history.

(56) References Cited

U.S. PATENT DOCUMENTS

| | | | | |
|---|---|---|---|---|
| 4,158,875 A | * | 6/1979 | Tajima et al. ............... | 361/695 |
| 4,797,783 A | * | 1/1989 | Kohmoto et al. ........... | 361/695 |
| 6,525,937 B2 | * | 2/2003 | Yanagida .................... | 361/695 |
| 6,538,881 B1 | * | 3/2003 | Jeakins et al. .............. | 361/687 |
| 6,628,520 B2 | * | 9/2003 | Patel et al. ................. | 361/696 |
| 6,987,673 B1 | * | 1/2006 | French et al. ............... | 361/727 |
| 7,061,759 B2 | * | 6/2006 | Karppinen et al. ......... | 361/695 |
| 7,154,748 B2 | * | 12/2006 | Yamada ...................... | 361/690 |
| 7,182,208 B2 | * | 2/2007 | Tachibana ................... | 211/26 |
| 7,236,362 B2 | * | 6/2007 | Wang et al. ................ | 361/695 |
| 2007/0151707 A1 | * | 7/2007 | Lyons et al. .......... | 165/104.21 |

\* cited by examiner

*Primary Examiner*—Michael Datskovskiy
(74) *Attorney, Agent, or Firm*—Kratz, Quintos & Hanson, LLP

(57) ABSTRACT

A second duct is designed to oppose its air outlet to a portion of an air inlet of a first duct in an electronic apparatus. The wall member closes the air inlet of the first duct at a position outside the air outlet of the second duct. An opening is defined in the wall member. The opening enables a connection between the outer space of the second duct and the air inlet of the first duct. Airflow enters the air inlet of the first duct from the air outlet of the second duct as well as from the opening of the wall member, respectively.

9 Claims, 6 Drawing Sheets

ELECTRONIC APPARATUS

BACKGROUND OF THE INVENTION

1. Field of the Invention

The present invention relates to an electronic apparatus such as a server computer.

2. Description of the Prior Art

System board units and input/output units are incorporated in a server computer. The system board units and the input/output units include printed circuit board units. The printed circuit board units are kept in an upright attitude. The printed circuit board units are respectively incorporated in ducts extending in the vertical direction.

The input/output units are designed to be smaller than the system board units in size. The air outlets of the ducts of the input/output units are thus opposed to portions of the air inlets of the ducts of the system board units. A predetermined wall member is utilized to close the air inlets of the ducts of the system board units at a position outside the air outlets of the ducts of the input/output units.

A fan or fans are opposed to the air outlets of the system board units. The fan or fans are driven to rotate so as to generate airflow running through the ducts of the input/output units and the ducts of the system board units in this sequence. However, no airflow is allowed to run into a space behind the wall member because the air inlets of the ducts of the system board units are designed to be larger than the air outlets of the ducts of the input/output units as described above. The printed circuit board units of the system board units cannot be placed at a position closer to the wall member. This inevitably causes an increase in the size of the server computer.

SUMMARY OF THE INVENTION

It is accordingly an object of the present invention to provide an electronic apparatus capable of a reduction in size without causing hindrance of airflow.

According to a first aspect of the present invention, there is provided an electronic apparatus comprising: an enclosure; a first unit placed in the enclosure, the first unit including a first duct defining an air inlet opened along a horizontal plane; a second unit placed in the enclosure, the second unit including a second duct defining an air outlet opposed to a portion of the air inlet of the first duct; a wall member extending along a horizontal plane, the wall member designed to close the air inlet of the first duct at a position outside the air outlet of the second duct; and an opening formed in the wall member, the opening enabling a connection between the outer space of the second duct and the air inlet of the first duct.

The second duct is allowed to define the air outlet opposed to a portion of the air inlet of the first duct in the electronic apparatus. The wall member closes the air inlet of the first duct at a position outside the air outlet of the second duct. An opening is formed in the wall member. The opening enables a connection between the outer space of the second duct and the air inlet of the first duct. Airflow enters the air inlet of the first duct from the air outlet of the second duct as well as from the opening of the wall member. The airflow is thus allowed to run into a space behind the wall member. The airflow of a sufficient quantity runs through the first duct from the air inlet of the first duct toward the air outlet of the first duct. Moreover, the first duct or first unit can be placed at a position closer to the second duct or second unit. This results in a reduced size of the enclosure containing the first and second units.

The first unit of the electronic apparatus may include a printed wiring board incorporated in the first duct, the printed wiring board extending from the air inlet of the first duct toward the air outlet of the first duct. The airflow of a sufficient quantity runs through the first duct from its air inlet toward its air outlet as described above. The airflow can run along the printed wiring board. The airflow can efficiently absorb heat from the printed wiring board. The second unit may include a printed wiring board incorporated within the second duct, the printed wiring board extending from the air inlet of the second duct toward the air outlet of the second duct. The airflow can efficiently absorb heat from the printed wiring board in the same manner as mentioned above. In this case, the electronic apparatus may further comprise a back panel placed in the enclosure, the back panel receiving the first and second units for connection. Additionally, the electronic apparatus may further comprise a fan having blades opposed to the air outlet of the first duct.

According to a second aspect of the present invention, there is provided an electronic apparatus comprising: an enclosure; a first unit placed in the enclosure, the first unit defining openings at the top and bottom thereof, respectively; a second unit placed in the enclosure at a position above the first unit, the second unit defining openings at the top and bottom thereof, respectively, the second unit having a depth or third dimension larger than the depth or third dimension of the first unit; a wall member designed to close the opening defined at the bottom of the second unit at a position outside the opening defined at the top of the first unit; and an opening formed in the wall member.

The second unit has a depth or third dimension larger than the depth or third dimension of the first unit in the electronic apparatus. The opening defined at the bottom of the second unit is thus partly opposed to the opening defined at the top of the first unit. The wall member closes the opening defined at the bottom of the second unit at a position outside the opening defined at the top of the first unit. The opening is formed in the wall member. Airflow enters the opening defined at the bottom of the second unit from the opening defined at the top of the first unit as well as from the opening of the wall member. The airflow is thus allowed to run into a space behind the wall member. The airflow of a sufficient quantity runs through the second unit from the bottom of the second unit toward the top of the second unit. Moreover, the second unit can be placed at a position closer to the first unit. This results in a reduced size of the enclosure containing the first and second units.

The electronic apparatus may further comprise a fan generating airflow running in the enclosure from the first unit toward the second unit. Airflow runs into the second unit from the opening defined at the top of the first unit as well as from the opening defined in the wall member. The opening defined at the top of the first unit and the opening defined at the bottom of the second unit may partly be connected to each other in the electronic apparatus.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
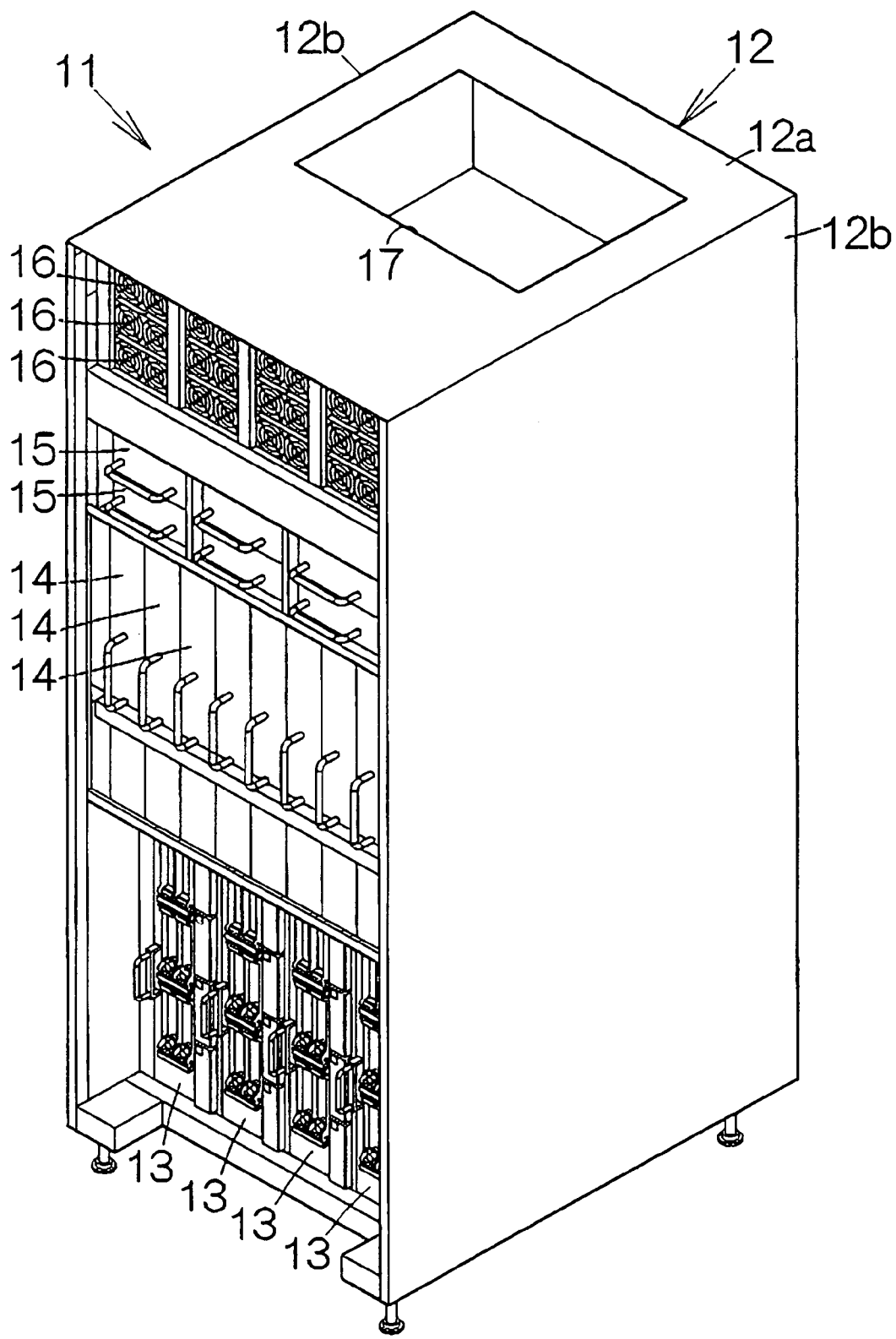
FIG. 1 is a perspective view schematically illustrating a server computer as a specific example of an electronic apparatus according to the present invention.

FIG. 1 schematically illustrates a server computer 11 as a specific example of an electronic apparatus according to the present invention. The server computer 11 includes an enclosure 12. Four input/output units 13 are mounted on the bottom rack of the enclosure 12, for example. The input/output units 13 are arranged in parallel with one another. The input/output units 13 are individually coupled to a back panel placed within the enclosure 12 as described later in detail.

Eight system board units 14 are mounted on the middle rack of the enclosure 12, for example. The system board units 14 are arranged in parallel with one another. The system board units 14 are individually coupled to the back panel in the same manner as the input/output units 13. The system board units 14 have dimensions larger than that of the input/output units 13.

Fan units 15 are mounted on the upper rack of the enclosure 12. The individual fan unit 15 includes axial flow fans, for example. Rotors are incorporated in the axial flow fans, respectively. The rotors are driven to rotate in the fan units 15 so as to generate airflow in the enclosure 12. The rotation axes of the rotors are set to extend in the vertical direction. The generated airflow thus runs in the vertical direction from the bottom of the enclosure 12 toward the top of the enclosure 12, for example.

Power source units 16 are mounted on the uppermost rack of the enclosure 12. The server computer 11 is coupled to an outlet through a power cable. The power source units 16 serve to transform the alternating current supplied from the outlet into the direct current. The direct current is supplied to the fan units 15 and the aforementioned back panel. The back panel passes the direct current to the input/output units 13 and the system board units 14.

The enclosure 12 includes a panel at the top of the enclosure 12, namely a top panel 12a, extending in the horizontal direction parallel with the floor. An air discharge opening 17 is formed in the top panel 12a. The enclosure 12 also includes panels at the opposite sides of the enclosure 12, namely side panels 12b, extending in the vertical direction. The input/output units 13 and the system board units 14 are inserted into the enclosure 12 from the front of the enclosure 12.

Figure 2:
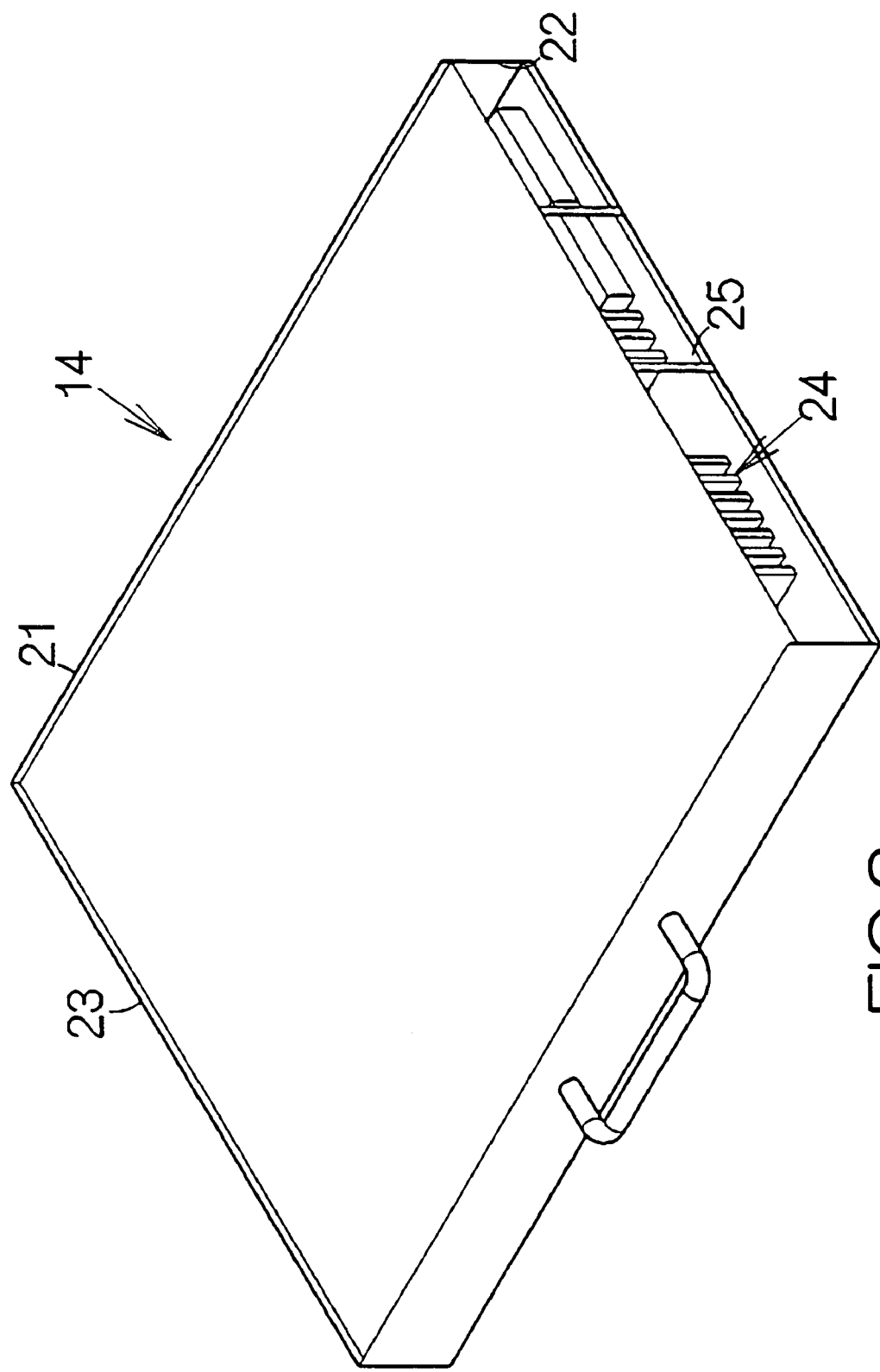
FIG. 2 is a perspective view schematically illustrating a system board unit.

As shown in FIG. 2, the individual system board unit 14 as a first unit includes a first duct 21 defining a hollow space of a flat parallelepiped, for example. A first duct 21 is kept in an upright attitude in the vertical direction in the server computer 11. An opening, namely an air inlet 22, is formed at the bottom of the first duct 21. Likewise, an opening, namely an air outlet 23, is formed at the top of the first duct 21.

A printed circuit board unit 24 as a system board is placed in the hollow space of the first duct 21. The printed circuit board unit 24 includes a printed wiring board 25. The printed wiring board 25 extends from the air inlet 22 toward the air outlet 23. Electronic circuit elements such as a central processing unit (CPU) and a memory are mounted on the printed wiring board 25, for example. The CPU executes various kinds of processing based on software programs and/or data temporarily stored in the memory, for example.

Figure 3:
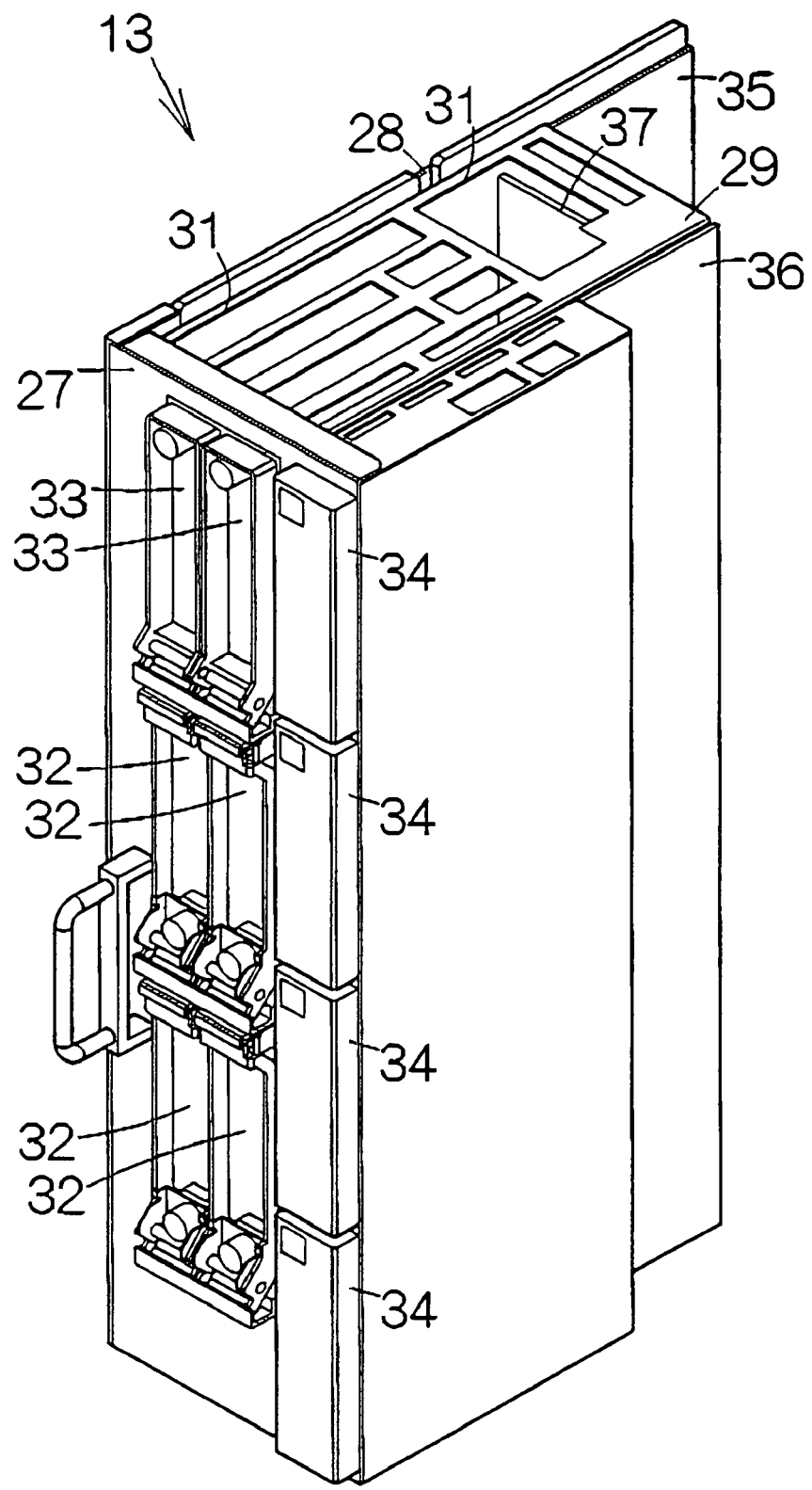
FIG. 3 is a perspective view schematically illustrating an input/output unit.

As shown in FIG. 3, the individual input/output unit 13 as a second unit includes a front panel 27 at the front of the input/output unit 13. The input/output unit 13 also includes a side panel 28 at a side of the input/output unit 13. The side panel 28 is coupled to the front panel 27. The side panel 28 is set perpendicular to the front panel 27. The front and side panels 27, 28 are kept in an upright attitude in the vertical direction.

The input/output unit 13 includes a top panel 29 extending in the horizontal direction at the top of the input/output unit 13. The top panel 29 may be attached to the front and side panels 27, 28. The top panel 29 may be set perpendicular to the front and side panels 27, 28. Openings 31 are formed in the top panel 29, for example.

PCI adapters 32, board management controller (BMC) adapters 33 and hard disk drives (HDDs) 34 are inserted into the front panel 27. PCI boards are respectively incorporated in the PCI adapters 32. LAN cables are coupled to the PCI boards, for example. BMC boards are respectively incorporated in the BMC adapters 33. The BMC boards are designed to control the input/output of the partitions of the server computer 11.

The input/output unit 13 includes a first printed wiring board 35 superposed on the side panel 28 and a second printed wiring board 36 extending in parallel with the first printed wiring board 35. A connector, not shown, is mounted on the first printed wiring board 35, for example. The connecter is utilized to couple the first printed wiring board 35 with the back panel. The hard disk drives 34 are mounted on the second printed wiring board 36.

A third printed wiring board 37 is placed in a space between the first and second printed wiring boards 35, 36. The third printed wiring board 37 is coupled to the first printed wiring board 35 in an attitude upright to the first printed wiring board 35. The aforementioned PCI boards and BMC boards are coupled to the third printed wiring board 37. Connectors maybe employed for the coupling, for example. The first to third printed wiring boards 35, 36, 37 are kept in an upright attitude in the vertical direction.

Figure 4:
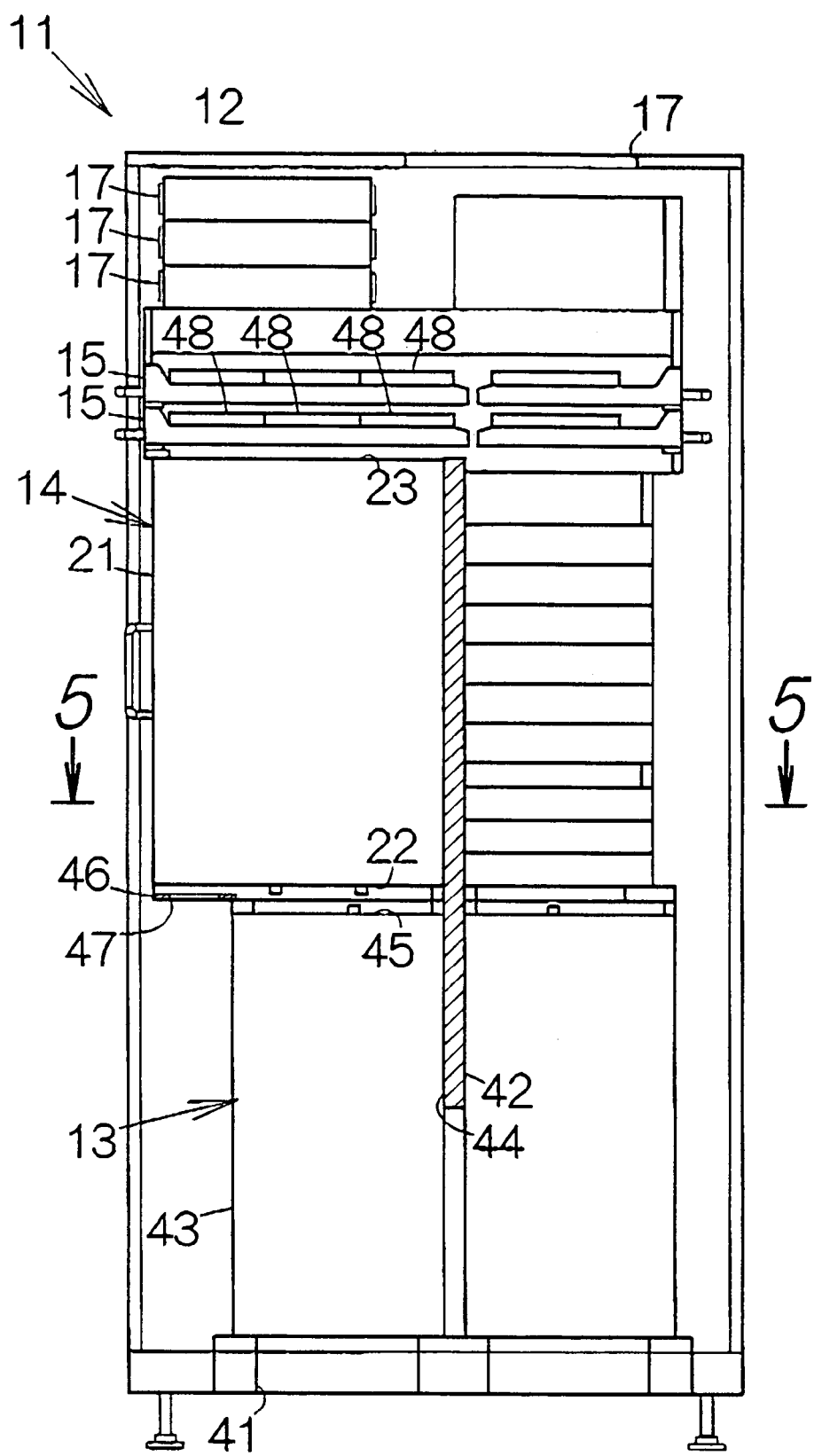
FIG. 4 is a sectional view schematically illustrating the inner structure of the server computer.

As shown in FIG. 4, an air intake opening 41 is formed at the bottom of the enclosure 12. The air intake opening 41 is opposed to the floor. A fresh air is introduced into the inner space of the enclosure 12 through the air intake opening 41. A back panel 42 is placed within the inner space of the enclosure 12. The back panel 42 stands upright in the vertical direction. The aforementioned input/output units 13 and system board units 14 are coupled to the front surface of the back panel 42. The depth or third dimension of the system board units 14 is set larger than that of the input/output units 13.

The front and side panels 27, 28 of the individual input/output unit 13, the back panel 42, and the side panel 28 of the adjacent input/output unit 13 in combination define a space as a second duct 43. The second duct 43 defines an opening, namely an air inlet 44. The air inlet 44 is opposed to the air intake opening 41 of the enclosure 12. The second duct 43 also defines an opening, namely an air outlet 45, opened at a horizontal plane. The first to third printed wiring boards 35, 36, 37, the PCI boards and the BMC boards extend from the air inlet 44 toward the air outlet 45 within the second duct 43.

Figure 5:
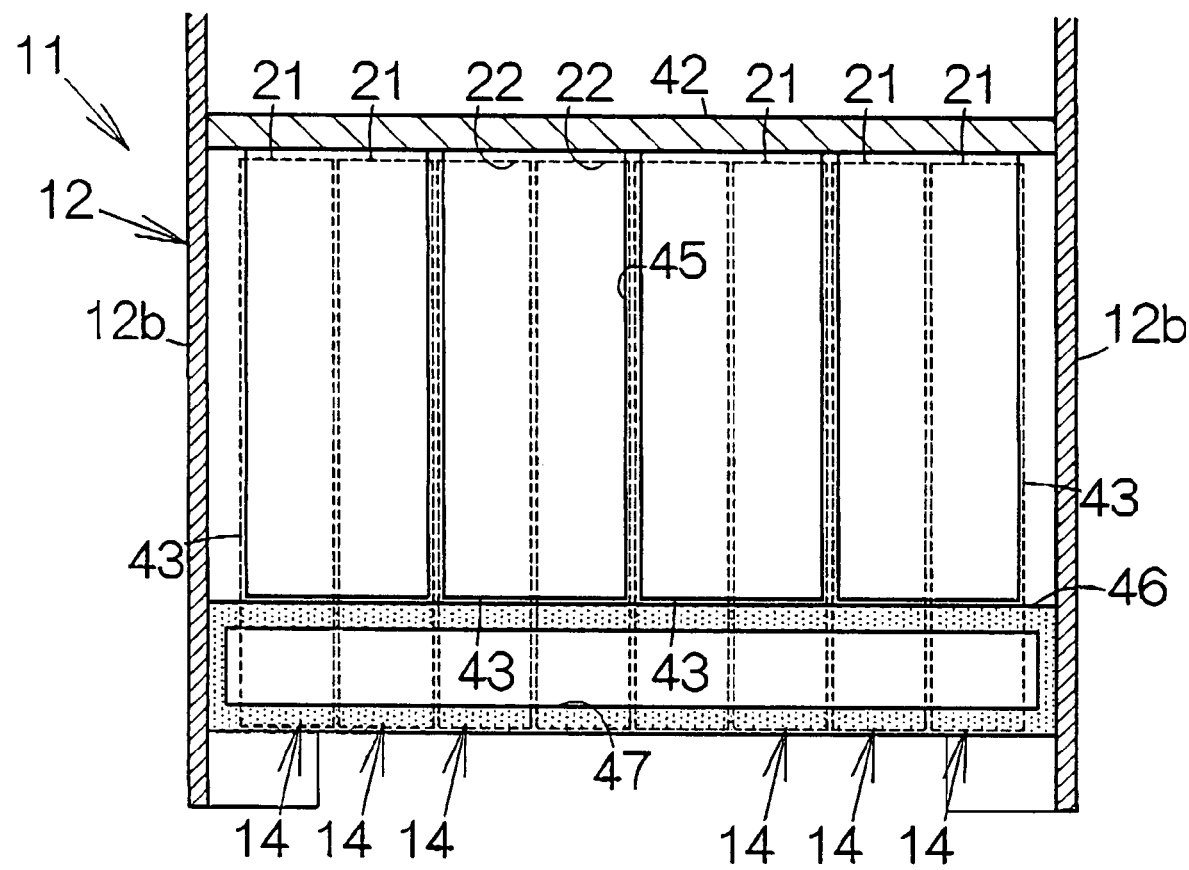
FIG. 5 is a partial sectional view taken along the line 5-5 in FIG. 4.

The air inlets 22 of the first ducts 21 extend along a horizontal plane in the enclosure 12. The system board units 14 have dimension larger than that of the input/output units 13 as described above. Referring also to FIG. 5, the air outlets 45 of the second ducts 43 are opposed to portions of the air inlets 22 of the first ducts 21. Here, the air outlet 45 of the individual second duct 43 is opposed to portions of a pair of the adjacent air inlets 22, 22.

A wall member 46 is utilized to close the air inlets 22 of the first ducts 21 at a position outside the air outlets 45 of the second ducts 43. The wall member 46 extends along the horizontal plane. An opening 47 is formed in the wall member 46. The opening 47 enables a connection between the outer space of the system board units 14 and the air inlets 22 of the first air ducts 21. The air inlets 22 of the first ducts 21 are thus opposed to the air outlets 45 of the second ducts 43 as well as the opening 47 of the wall member 46.

As is apparent from FIG. 5, the opening 47 extends straight from one of the side panels 12b toward the other side panel 12b. The opening 47 extends perpendicularly to the printed wiring boards 25. The opening 47 is thus connected to all of the air inlets 22 of the first ducts 21. The air outlets 23 of the first ducts 21 are opposed to the blades, not shown, of fans 48 in the fan units 15.

Figure 6:
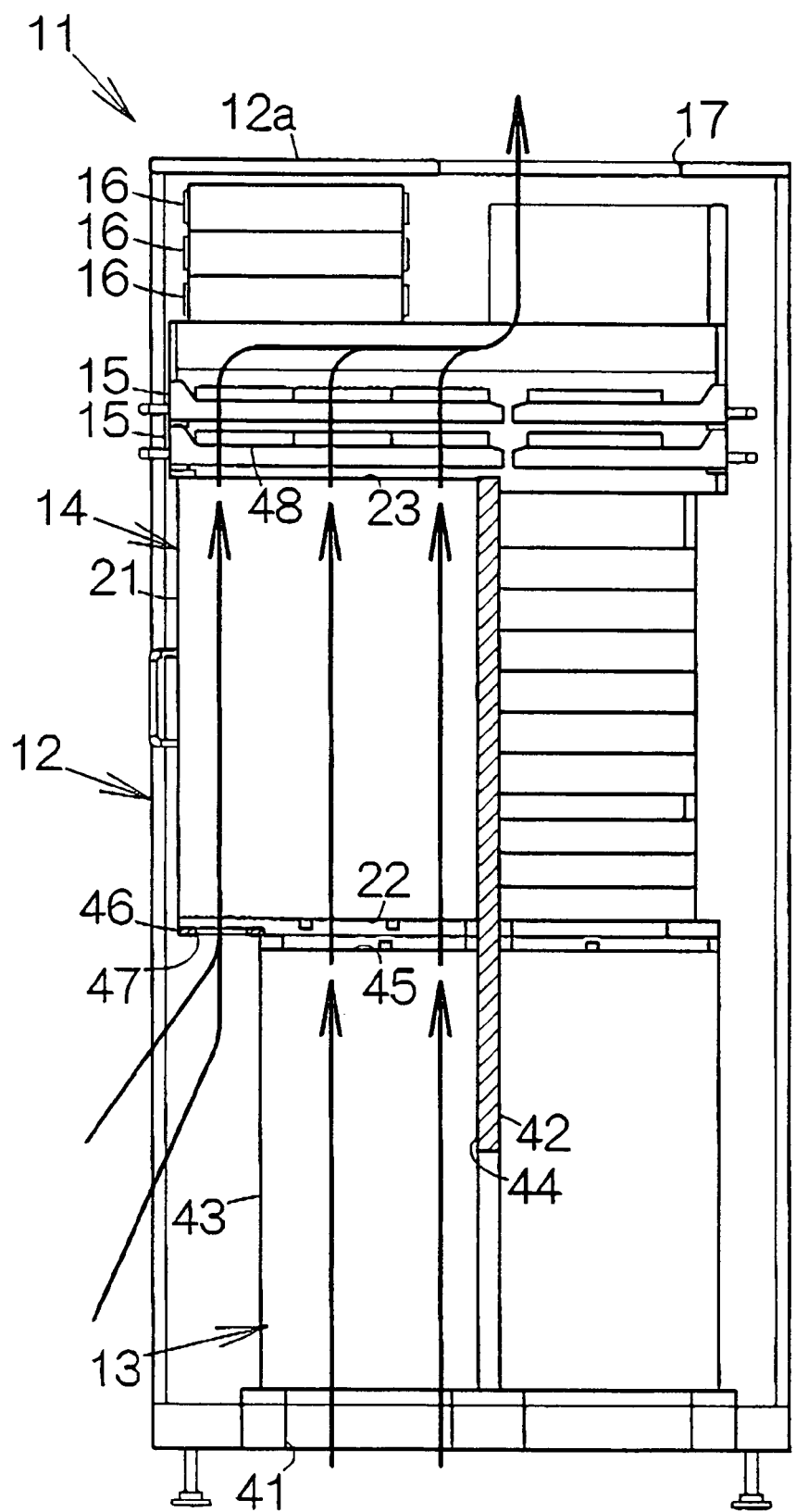
FIG. 6 is a sectional view, corresponding to FIG. 4, for schematically illustrating the path of airflow.

Now, assume that airflow is generated in the enclosure 12 with the assistance of the fans 48 of the fan units 15. The rotors rotates for generation of airflow in the fans 48. A fresh air is introduced into the enclosure 12 through the air intake opening 41. As shown in FIG. 6, airflow runs in the vertical direction through the second ducts 43 from the air inlets 44 toward the air outlets 45. The airflow absorbs heat from the electronic circuit elements on the first to third printed wiring boards 35, 36, 37 and the PCI boards. The electronic circuit elements and the PCI boards are thus prevented from a rise in temperature.

The airflow then enters the first ducts 21 through the air inlets 22. The airflow runs in the vertical direction through the first ducts 21 from the air inlets 22 toward the air outlets 23. The airflow absorbs heat from the electronic circuit elements on the printed wiring boards 25. The electronic circuit elements are thus prevented from a rise in temperature. The airflow is discharged outside the enclosure 12 through the air discharge opening 17 of the enclosure 12 with the assistance of the fan units 15.

Simultaneously, a fresh air is also introduced into the enclosure 12 through the opening 47. Airflow enters the first ducts 21 through the air inlets 22. The airflow runs through the first ducts 21 from the air inlets 22 toward the air outlets 23 in parallel with the airflow from the air outlets 45. The airflow absorbs heat from the electronic circuit elements on the printed wiring boards 25. The electronic circuit elements are thus prevented from a rise in temperature. The airflow is discharged outside the enclosure 12 through the air discharge opening 17 with the assistance of the fan units 15.

Here, the extent of the opening 47 may depend on the pressure within the second ducts 43. Specifically, the extend of the opening 47 may be adjusted to equalize the pressure of the airflow from the opening 47 into the air inlets 22 with that of the airflow from the air outlets 45 of the second ducts 43 into the air inlets 22. The airflow of a sufficient quantity is allowed to run through the second ducts in this manner.

The air outlets 45 of the second ducts 43 are opposed to the portions of the air inlets 22 of the first ducts 21 in the server computer 11. The wall member 46 serves to close the air inlets 22 of the first ducts 21 at a position outside the air outlets 45 of the second ducts 43. The opening 47 is formed in the wall member 46. The opening 47 enables a connection between the outer space of the second ducts 43 and the air inlets 22 of the first air ducts 21. The airflow thus enters the air inlets 22 of the first ducts 21 from the air outlets 45 of the second ducts 43 as well as from the opening 47 of the wall member 46. The airflow is allowed to run into a space behind the wall member 46 in this manner. The airflow of a sufficient quantity is allowed to run through the first ducts 21 from the air inlets 22 toward the air outlets 23. In addition, the first ducts 21 or system board units 14 can be placed at a position closer to the second ducts 43 or input/output units 13. This results in a reduced size of the enclosure 12 containing the input/output units 13 and the system board units 14.

What is claimed is:

1. An electronic apparatus comprising:
  an enclosure;
  a first unit placed in the enclosure, said first unit including a first duct defining an air inlet opened along a horizontal plane;
  a second unit placed in the enclosure, said second unit including a second duct defining an air outlet opposed to a portion of the air inlet of the first duct;
  a wall member extending along a horizontal plane, said wall member designed to close the air inlet of the first duct at a position outside the air outlet of the second duct; and
  an opening formed in the wall member, said opening enabling a connection between an outer space of the second duct and the air inlet of the first duct.

2. The electronic apparatus according to claim 1, wherein the first unit includes a printed wiring board incorporated within the first duct, said printed wiring board extending from the air inlet of the first duct toward an air outlet of the first duct.

3. The electronic apparatus according to claim 2, wherein the second unit includes a printed wiring board incorporated within the second duct, said printed wiring board extending from an air inlet of the second duct toward the air outlet of the second duct.

4. The electronic apparatus according to claim 3, further comprising a back panel placed in the enclosure, said back panel receiving the first and second units for connection.

5. The electronic apparatus according to claim 1 further comprising a fan having blades opposed to the air outlet of the first duct.

6. An electronic apparatus comprising:
  an enclosure;
  a first unit placed in the enclosure, said first unit defining openings at a top and a bottom thereof, respectively;
  a second unit placed in the enclosure at a position above the first unit, said second unit defining openings at a top and a bottom thereof, respectively, said second unit having a depth larger than a depth of the first unit;
  a wall member closing the opening defined at the bottom of the second unit at a position outside the opening defined at the top of the first unit; and
  an opening formed in the wall member.

7. The electronic apparatus according to claim 6, wherein the opening defined at the top of the first unit and the opening defined at the bottom of the second unit are partly connected to each other.

8. The electronic apparatus according to claim 6, further comprising a fan generating airflow running in the enclosure from the first unit toward the second unit, wherein the airflow runs into the second unit through the opening defined at the top of the first unit and the opening defined in the wall member, respectively.

9. The electronic apparatus according to claim 8, wherein the opening defined at the top of the first unit and the opening defined at the bottom of the second unit are partly connected to each other.

* * * * *